United States Patent [19]

Verhulst

[11] 4,151,601
[45] Apr. 24, 1979

[54] MAGNETIC DOMAIN MEMORY DEVICE WITH AN IMPROVED DETECTOR

[75] Inventor: Antonius G. H. Verhulst, Eindhoven, Netherlands

[73] Assignee: U.S. Philips Corporation, New York, N.Y.

[21] Appl. No.: 827,854

[22] Filed: Aug. 26, 1977

[30] Foreign Application Priority Data

Sep. 10, 1976 [NL] Netherlands .................. 7610054

[51] Int. Cl.² ........................................... G11C 19/08
[52] U.S. Cl. ..................................... 365/8; 365/12; 365/14; 365/23; 365/43
[58] Field of Search .................... 365/7, 8, 43

[56] References Cited

U.S. PATENT DOCUMENTS 4,056,814  11/1977  Bobeck et al. ................. 365/8

OTHER PUBLICATIONS

IBM Technical Disclosure Bulletin—vol. 19, No. 6, 11/1976, pp. 1960–1961, pp. 365–368.

Primary Examiner—James W. Moffitt
Attorney, Agent, or Firm—Thomas A. Briody; James J. Cannon, Jr.

[57] ABSTRACT

A magnetic domain memory in which domains are driven along a structure of discrete elements which includes at least two domain detection elements formed by interconnected chevrons. The detection signal is based upon the magnetoresistive effect of the series of chevrons. The domain detection elements are pair-wise connected to inputs of a difference determining unit. The detection elements of a pair are disposed 180° relative to each other in the plane of the plate, but are otherwise substantially identical. The detection elements are generally asymmetrical in the sense that a majority of pairs of successive chevron elements are interconnected in positions situated between their center and a corresponding end. Thus, upon passage of a domain within a period of the rotary magnetic field, a comparatively large and a comparatively small domain signal can periodically be generated.

6 Claims, 16 Drawing Figures

MAGNETIC DOMAIN MEMORY DEVICE WITH AN IMPROVED DETECTOR

BACKGROUND OF THE INVENTION

The invention relates to a memory device, including a plate of magnetic material for storing digital information in the form of magnetic domains, a main magnetic field generator for sustaining the domains by means of a bias magnetic field which is directed approximately transversely of the plate, and a rotary magnetic field generator for driving the domains along a domain guide structure which comprises discrete, magnetic elements. At least one discrete magnetic element is connected as a domain detection element by being connected to an output of a detection current generator. The domain detection element includes a series of magnetic and electrically series-connected, at least substantially chevron-shaped elements. The detection element is connected to an input of a pick-up element. A device of this kind is known from the article by A. H. Bobeck et al., Evolution of Bubble Circuits Processed by a Single Mask Level, IEEE Transactions on Magnetics, Vol. MAG 9, September 1973, pages 474 ff. FIG. 3 of this article shows a number of detector configurations. The detector element consists of a series of chevrons (of permalloy), successive chevrons being electrically connected either at their centers, or at alternating ends, or at the centres of alternating chevron legs, i.e. the portions situated between the center and an end. The detection elements form part of a domain guide structure. A rotary magnetic field which rotates in the plane of the plate drives the domains in a direction which is transversely to the symmetry axis of the chevrons. When a domain passes the detection element, a detection signal is supplied as a result of a magneto-resistance effect under the influence of the rotary magnetic field and the presence or absence of a domain.

Configurations of this kind have the advantage that they may be composed of a single layer of material having a suitable magneto-resistive effect as well as a suitable electrical conductivity. They have a further advantage in that the sensitivity of the detection element can be increased by the use of a larger number of chevrons; a passing domain expands further, but continues to exhibit coherence. Detection elements of this kind have the drawback that two signals are supplied with a mutual phase difference of approximately 180° (related to one period of the rotary magnetic field), both signals being determined by magnetoresistance variation and also being determined in approximately the same manner by the possibly present domain. Moreover, the domain-determined part of the signal is influenced by the data rate and is notably reduced if two domains are presented to the detection element in directly successive periods of the rotary magnetic field. The signal-to-noise ratio may thus be inadmissibly reduced. The problem can be solved by separating two domains or two information-carrying domain positions (full or void) each time by an information-less void period, but the bit data rate is then substantially halved.

SUMMARY OF THE INVENTION

The invention has for its object to provide improved detection in a magnetic domain memory device. To this end, the invention utilizes detection elements which are over-all asymmetrical. The elements in accordance with said article are defined as being over-all symmetrical, since the bridges between successive chevrons therein are either arranged centrally, substantially according to a straight line, or alternating at the equal distances from the center at the left or the right. In accordance with the invention, the majority of the bridges are situated on one side of the center. This majority may be, for example ⅔, but may also be as large as 100%. The invention is not restricted to the ideal chevron shape, but also covers the use of approximately chevron-shaped elements which can be arranged in a series as will be described hereinafter.

The improvement in accordance with the invention is achieved in that, in order to form a generally asymmetrical detection element, a majority of pairs of successive elements of said series are interconnected at locations between their center and each time a similar end in order to generate, for each passing domain, and each time within a period of the rotary magnetic field, a comparatively large and a comparatively small domain signal at different instants. It has been found that the comparatively larger one of the two said detection signals is hardly influenced by the information content of directly preceding or directly subsequent periods of the operation, so that in each period of the rotary magnetic field a domain can indeed be applied to the detection element, so that a high bit data rate is obtained. It has also been found that the signal-to-noise ratio of the detector in accordance with the invention is good. The large and small detection signals are both associated with signals which are caused by the detector alone (without domain), but these signals can be compensated for in a known manner by a dummy detector.

Preferably, there is provided a control element for driving the domains to said detection element mainly by a first direction of rotation of the rotary magnetic field, each time similar ends being situated on the output side of the detection element. A favorable signal-to-noise ratio os thus realized. It has been found that a domain in a "forward" period of the drive supplies only a "small" signal when it jumps towards the series of chevrons. One half period of the rotary magnetic field later, it supplies a "large" signal when it jumps from a location near the symmetry axis of the chevron elements to a location near the output side of the chevron elements. In the latter case the majority of bridges which are arranged at this area are passed. In some cases the opposite propagation direction can also result in a favorable signal-to-noise ratio.

Preferably, the domain guide structure comprises a shift register structure for domains, having an output which is connected to said detection element, domains containing information and void domain positions containing information being arranged in the shift register structure in direct succession in order to supply an information entity to the detection element, when driven by the rotary magnetic field, in each period of this field.

Known menory devices often utilize an organization according to major loop and minor loop, and the invention offers a simpler organization with a high density of bits per unit of surface area of the plate. Preferably, the shift register structure then comprises a domain splitting element, having a first output connected to an input of the shift register structure and a second output connected to an input of the domain detection element, and an input connected to an output of the shift register structure. Non-destructive reading is thus simply effected.

It is advantageous for a memory device to comprise a first and a second device as described, the first and second memory device each comprising at least one substantially identical detection element, the detection elements being arranged to be rotated substantially 180° relative to each other in the plane of the plate, each of the two detection elements having a connection connected to relevant inputs of a "pick-up" element which is connected as a difference-determining unit. The pick-up element thus receives the detection signals of the domains or void domain positions containing information at mutual phase differences of each time 180° (related to the period of the rotary magnetic field), so that two bit signals can be supplied for each field period. It has been found that the detection signals of each separate detection element also differ approximately 180° in phase. The two memory devices may be identical, which implies low development costs. Furthermore, a small number of pick-up elements suffices. In many cases the number of connections to the plate of magnetic material will also be small. Furthermore, it is also possible for two detection elements to be connected to outputs of the same memory device (for example, a single shift register structure), both elements leading to relevant inputs of a single pick-up element. An increased bit frequency or a small number of connections for the pick-up elements is then also achieved. A pick-up element may be understood to mean a difference determining unit, but it may also be a difference determining unit which directly executes the subtraction currents/voltages in accordance with the Kirchhoff principles. Therefore it may operate according to analog or digital signals.

DESCRIPTION OF THE DRAWINGS

The invention will be described in detail hereinafter with reference to some FIGS., and some of the terms used will also be defined more precisely.

DESCRIPTION OF THE PREFERRED EMBODIMENTS

Figure 1:
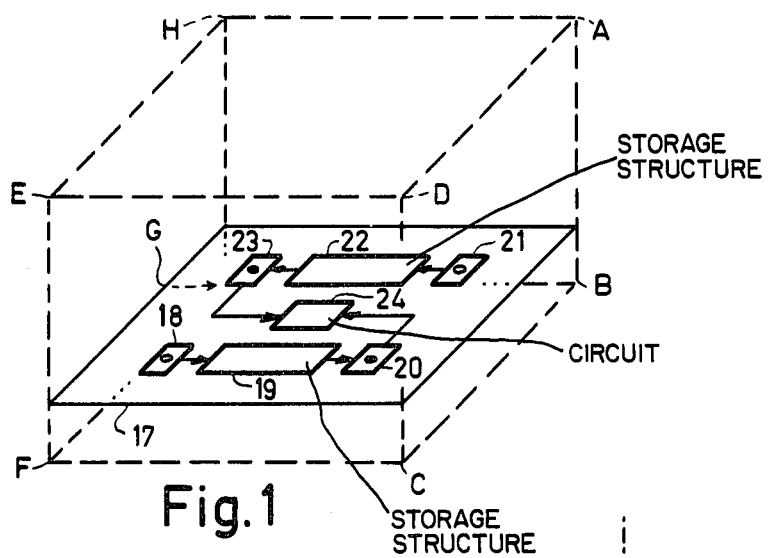
FIG. 1 shows a memory device in accordance with the invention.

FIG. 1 shows a memory device in accordance with the invention, comprising a plate of magnetic material 17 domain sources 18, 21, storage structures 19, 22, domain detection structures 20, 23 an electronic circuit 24, the assembly being situated in the block-shaped region ABCDEFGH. The upper and the lower face of this region, comprise for example, a system of permanent magnets for sustaining domains having, for example, a cylindrical shape in the plate 17 by a magnetic field directed transversely of the plane of the plate. The left and the right side face comprise means for periodically generating a magnetic field in the direction DE. A similar set of means may be provided in the front and the rear face. On the other hand, means of this line may be constructed as coil formers around the block A...H. Alternate activation of said means by periodic currents having a mutual phase difference of 90° results in a rotary magnetic field which is parallel to the plane of the plate. in synchronism with the period of the rotary field, the sources 18, 21 can generate domains, whether or not under the influence of additional control by further means for inserting an information bit in the domain sequence by the presence/absence of a domain. The domains are driven by the rotary magnetic field, or other means, to the storage structure 19, 22 which are organized. for example, in the form of a single loop. Each of these loops may contain a domain splitting element in a given location, whereby a domain applied to these splitting elements can be split in each period of the rotary magnetic field, so that a domain is applied to none, one or two of the domain detection elements 20,23 in dependence upon the information content of the domain series stored. The output signals thereof are applied to the electronic circuit 24 yet to be described. The plate 17 may be manufactured as a single coherent structure by the liquid phase epitaxy (LPE) process. In that case two domain guide structures may be present which have only the circuit 24 in common. On the other hand, they can actually also form a single coherent domain guide structure which comprises a detection output in two different locations. Each storage structure 19, 22 with associated elements may also be formed in a separate plate. The plate may also comprise four or more storage systems. The memory device may comprise a plurality of storage plates which are stacked in the direction AB or which are linked in some other manner. The structures on the plate may comprise further functional elements (for example, a domain destruction device) but this is not separately shown. The driving may furthermore be controlled by a control device. In its simplest form, this control device is, for example, a clock, which activates exclusively periods of the rotary magnetic field with one given sense of rotation. On the other hand, organizations are known with reversal of the sense of rotation; mainly the one sense of rotation then occurs, the other sense serving only to control diverging switches.

Figure 2A:
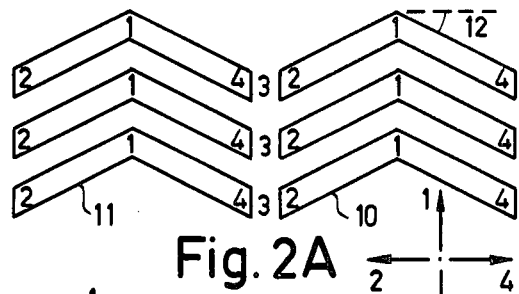
FIG. 2A shows a propagation structure for magnetic domains which is composed of chevrons.

FIG. 2A shows a propagation structure for magnetic domains which is composed of chevrons. The chevrons are arranged in parallel groups of three; for the driving of the domains, however, a sequence of single chevrons already suffices. If the direction of the rotary magnetic field corresponds to the arrow "1" of the system of coordinates, a preferred position for a domain present on the chevrons 11 is formed in the positions 1, which will be designated by the notation 111. If the rotary magnetic field is rotated counterclockwise over 90°, subsequently a preferred position arises in the positions 2 of the chevrons 11, notation 112. However, if the field rotates clockwise, the preferred position will be 114 after 90°. A domain is each time expanded strip-like in the direction of the arrow 1. After further clockwise rotation through 90°, the domain will be symmetrically situated around the positions denoted by 3, between the chevrons 10 and 11 and covers narrow end regions of both chevron strips. Further rotation through each time 90° results in the successive preferred positions 102, 101, 104. Alternatively, more chevron strips or single chevrons may be present, and the strips may also be connected to a drive structure consisting of T elements and I elements, Two successive domains may be present in the preferred positions 111, 101 and may travel further in synchronism; the period of the information flow then equals the period of the domain guide structure. On the other hand, the period of the information flow may also be twice or three times as large. The chevrons may have a different shape; for example, the angle 12 may be between, for example, 20° and 50°; 30° and 45° are frequently used values. The legs of the chevrons need not be exactly straight; for example, they may be slightly concave (the angle 12 is then comparatively larger). The ends of the legs may be rounded or be provided with small projections.

Figure 2B:
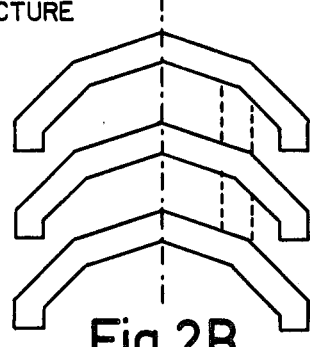
FIG. 2B shows an example of substantially chevron-shaped elements of a propagation structure.

FIG. 2B shows an example in accordance with the invention of substantially chevron-shaped elements of a propagation structure. These elements may also be repeated a large number of times in the direction of the symmetry axis (dashed-dot-line). Interrupted (or "dashed") lines denote possible interconnections which will be described in detail with reference to the FIGS. 3-12

Figure 3:
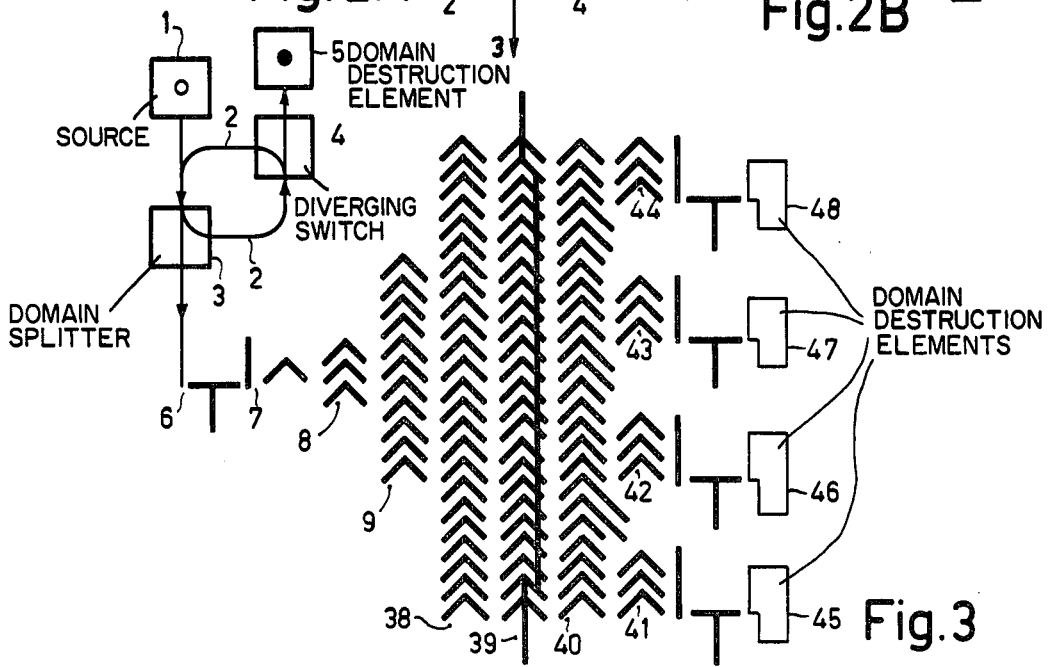
FIG. 3 shows the organization of a shift register in accordance with the invention.

FIG. 3 shows the oganization of a shift register in accordance with the invention. The device comprises a source of magnetic domains 1. The domains produced are driven to the loop structure 2. Subsequently, they can be driven, via the diverging switch 4, to the domain destruction element 5, so that a void domain position arises. Furthermore, they are continuously driven in the direction of the arrow by the rotary magnetic field (not shown). The element 3 is a domain splitter. Each domain arriving is split therein, part of the domain then completing the loop structure 2, while the other part is discharged in the direction of the path 6. The structure of the elements discussed thus far is of a conventional nature and may be constructed, for example, mainly by means of T-I elements of permalloy. The drawing is a detailed representation as from the point 6. After the last T-I structure, there is provided a chevron 7 which changes over, via a strip 8 of three chevrons and a strip 9 comprising eleven chevrons, to a strip 38 comprising twenty-four chevrons. The domain is then step-wise expanded along the chevron strip. The strip 39 comprises the detection element in that all chevrons are electrically interconnected, i.e. the outer ones along the symmetry axis and the remaining ones in the centers of corresponding legs. The magnetoresistance is influenced by the orientation of the rotary magnetic field and the presence of a domain, as will be explained hereinafter. Under the influence of a further period of the rotary magnetic field, the domain reaches the chevron strip 40. Subsequently, the strip domain is split into four parts on the sub-chevron strips 41-44. After further driving, the domain destruction elements 45-48 are reached. The destruction is more reliable as a result of the subdivision of the strip domain. The number of chevrons per strip may be different, for example 30-500. The domains are also being subdived into more parts and the expansion is also realized over more chevron strips.

Figure 4:
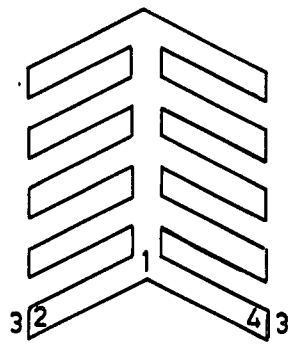
FIG. 4 shows the known configuration of a detection element.
Figure 5:
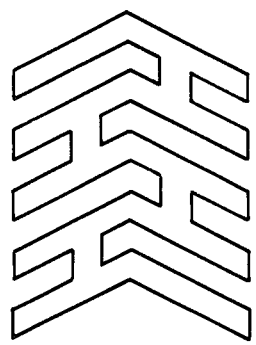
FIG. 5 shows a another known configuration of a detection element.
Figure 6:
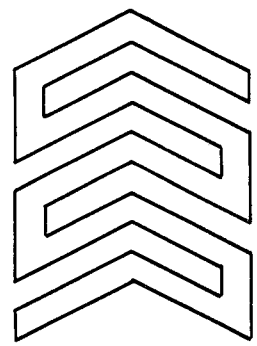
FIG. 6 shows a further known configuration of a detection element.

FIG. 4 shows a known configuration of a domain detection element as described in the above noted article by Bobeck. FIGS. 5, 6 show further examples from the Bobeck article. It has been found that all these structures supply two detection signals for each period of the rotary magnetic field, both signals each time consisting of two components which are determined by the magnetoresistancre of the permalloy: (a) a component which is determined by the direction of the rotary magnetic field; and (b) a component which is determined by the magnetization pattern of the plate of magnetic material which has been changed by the presence of a domain.

The first component always occurs twice for each period of the rotary magnetic field at mutual phase difference of approximately 180°. In this case of a generally symmetrical detection element the second component also occurs twice per period. In the case of driving by clockwise rotation of the rotary magnetic field, the first signal occurs when the domain moves from the position 3 to the position 2, and it occurs again when it moves from the position 1 to the position 4. Thus, these signals also occur at a mutual phase difference of 180° and, moreover, they are approximately equally strong for these generally symmetrical detection elements. In order to separate the domain signals from the rotary field signals, the known technique utilizes a corresponding dummy detector, the dummy detector not receiving domains in these operating conditions; thus, twice per period a detection signal of a domain is produced as a difference signal between the detection element used and the dummy detection element. The known detection elements have an additional drawback in that the domain signals are reduced in the case of two directly successive domains: the signal-to-noise ratio is then liable to be unacceptably reduced.

Figure 7:
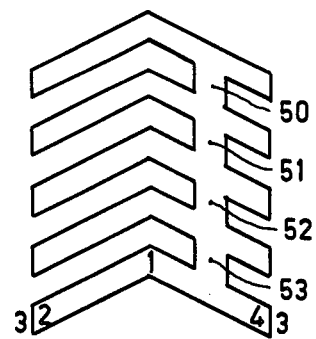
FIG. 7 shows a configuration of a detection element in accordance with the invention.

FIG. 7 shows the configuration of a detection element in accordance with the invention, which in this case comprises five chevrons. Generally, this number will be higher, for example, between 10 and 500; this is inter alia determined by the desired signal amplitude. The chevrons are connected by bridges 50-53 in the form of a strip which extends parallel to the symmetry axis of the chevrons which is denoted by a dash-dot line of FIG. 2b.

Figure 8:
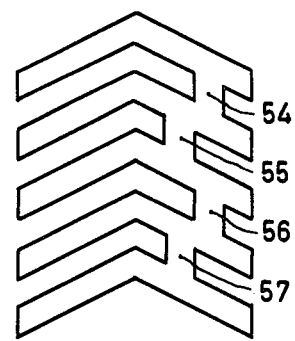
FIG. 8 shows a further configuration thereof.

FIG. 8 shows a slightly different configuration: the bridges 54-57 between the chevrons are again in parallel to the symmetry axis of the chevrons, but they do not all have the same eccentricity.

Figure 9:
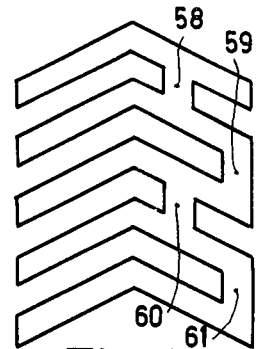
FIG. 9 shows a further configuration thereof.

FIG. 9 shows a further configuration yet in accordance with the invention; some of the bridges 58-61 are situated at the ends of the chevron legs, just like all bridges in FIG. 6 (be it there on alternating ends). Now, however, a majority of the bridges (2) all situated between the centers and the similar ends of the chevrons in FIG. 9, since no bridges are present on the other side.

Figure 10:
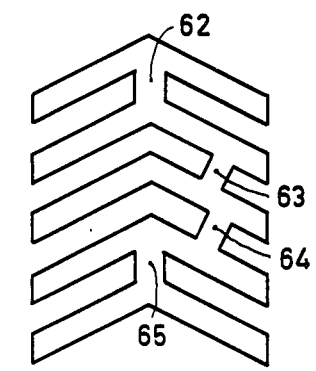
FIG. 10 shows a further configuration thereof.

FIG. 10 shows a further configuration in accordance with the invention. The bridges 62,65 connect the centers of two pairs of chevrons. The bridgres 63, 64 are situated as a majority (2) between a center and an end of the chevron legs and are directed transversely of these legs.

Figure 11:
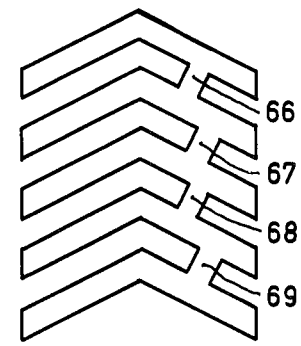
FIG. 11 shows a further configuration thereof.

FIG. 11 shows an example in which all bridges 66-69 do not have the same eccentricity.

Figure 12:
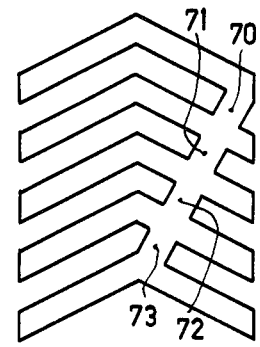
FIG. 12 shows a further configuration thereof.

This eccentricity difference is even greater yet in FIG. 12, because all bridges therein are situated according to a straight line. As has already been stated, the number of chevrons usually exceeds that shown in the FIGS. 7-12; the current connections have been omitted for the sake of simplicity. The configurations as shown in FIGS. 7, 11 offer favorable results in many cases; however bridges may also be situated on the other side of the symmetry axis of the chevrons in given cases. Summarizing, there is always an overall asymmetry in that the majority of the bridges arranged between the center and an end of chevron legs is present on one defined side of the chevron centers. In other cases, the chevrons themselves may be formed to be asymmetrical, either all chevrons in the same manner or in a different manner. The chevron strips in accordance with the invention satisfy two requirements:

(a) a majority of the bridges is situated on one side of the chevron peaks; and
(b) not too many bridges of the type 59, 61 of FIG. 9 may occur, because the further driving of the domains may otherwise be impeded.

FIG. 6 shows that 50% bridges in end positions does not yet impede further driving.

The further choice of the number of central bridges (62,65 in FIG. 10), end bridges (59, 61 in FIG. 9) intermediate bridges (58,60,63,64 in FIGS. 9,10) and possibly opposing bridges (as shown in FIGS. 5,6) depends on the various parameters of use of the memory device, such as the rotary field frequency, the materials used, the domain diameter, the reversal or not of the direction of rotation of the rotary magnetic field, etc.

Figure 14:
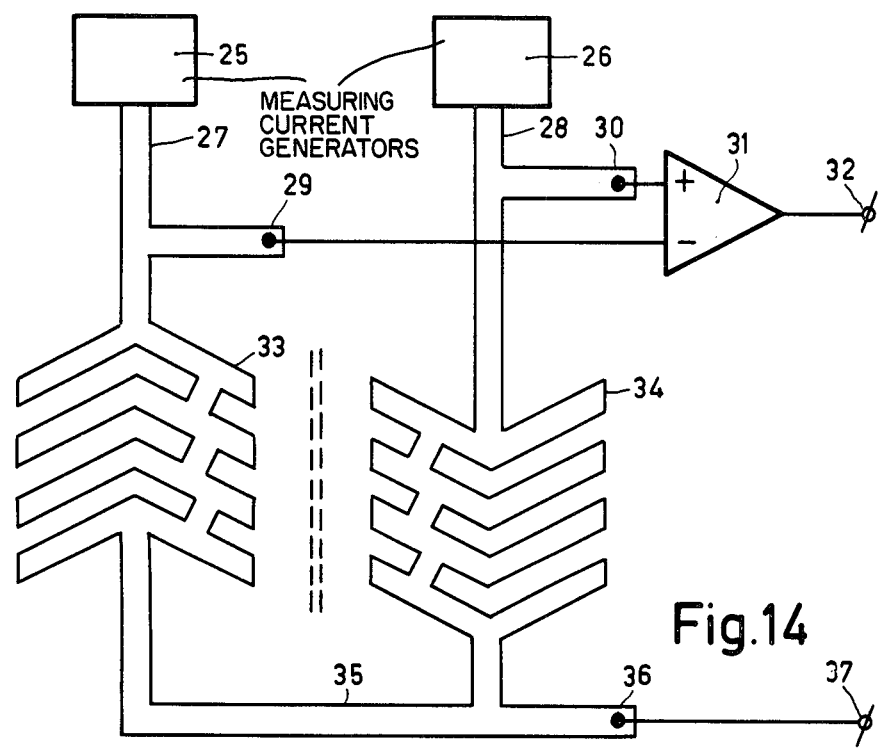
FIG. 14 shows a detection system in accordance with the invention.
Figure 13:
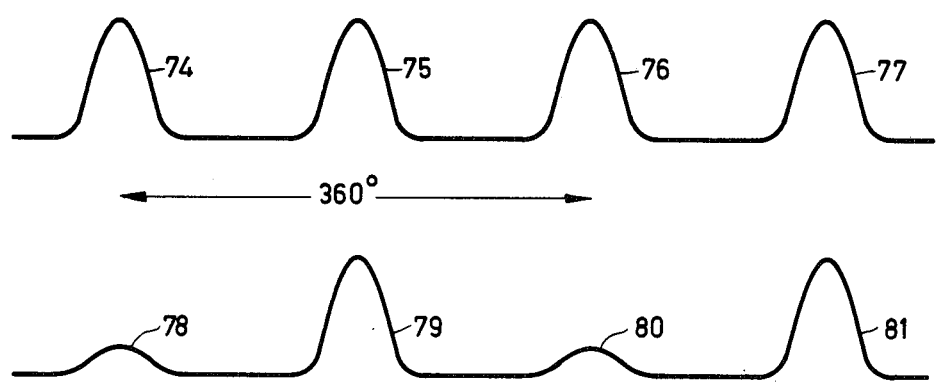
FIG. 13 shows a number of detection signals.
Figure 13:
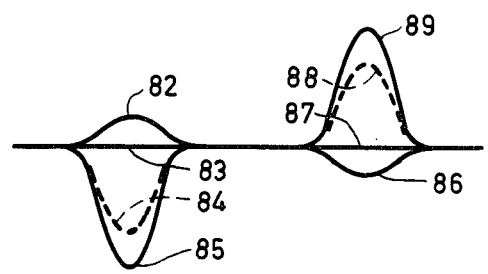

FIG. 13 shows a number of detection signals, and FIG. 14 shows a complete detection system in accordance with the invention. FIG. 14 shows two measuring current generators 25,26 two measuring currents conductor parts 27, 28, two connection points 29,30, a differential amplifier 31, two detection elements 33,34, a measuring current conductor 35, a connection point 36, and two output terminals 32, 37. The domain guide structures, field generators and the control are not shown for the sake of simplicity.

The terminal 37 is connected, for example, to ground. The generators 25, 26 apply equal currents, via the measuring current conductor paths and the series connected chevrons 33,34, to ground. The potentials at the points 29, 30 are then determined by the resistances of the detection elements, such resistances being influenced by magnetoresistive effects. The peak 74. . . 77 in FIG. 13 denote the domain signals if the detection elements were constructed, for example, in accordance with the FIGS. 4-6: two signals of approximately the same magnitude occur at mutual phase differences of each time 180°. The signals which occur also in the absence of a domain (i.e. the information "0"), under the influence of the rotary field, have been omitted. They are suppressed according to the known technique by the use of a dummy detection element and a phase difference determining unit. The peaks 78-81 in FIG. 13 denote the domain signals if the detection elements are constructed as indicated or in accordance with one of the FIGS. 7-12. The signals are now of unequal magnitude. The amplitude may relate as 1:4 as shown, but smaller ratios can also offer adequate discrimination already. In the case of clockwise rotation of the rotary magnetic field a "small" domain signal occurs (see FIG. 7) when a domain moves from the position 3 to the position 2, and a "large" domain signal occurs when a domain moves from the position 1 to the position 4. The domain signals then occur at more or less the same instants as the signals produced by the rotary magnetic field. The amplitudes of the "large" domain signals are hardly influenced by the presence or absence of a domain in an adjoining period. Suitable signals are also obtained in given cases by a mirror image arrangement of the detection elements about their central plane (or by reversal of the rotary magnetic field). A large domain signal then occurs upon displacement from the position 3 to the position 4, while a small domain signal occurs upon displacement from the position 1 to the position 2.

The domain signals of the detection elements 33 and 34 in FIG. 14 exhibit a phase difference of 180° so that they do not simultaneously supply a "large" domain signal. As a result of a subtract operation in the difference determining unit 31, a domain information signal can then be generated twice per period of the rotary magnetic field; for example, a positive signal of the element 34 and a negative signal of the element 33. The peaks 82,89 may then originate from the element 34. The signal curves 83,87 occur if none of the detection elements receives a domain. The signal peaks 85,6 are then domain signals from the detection element 33, i.e. originating from two directly successive domains (because the smallest peak always occurs first in the example). The peaks 84,88 occur as a result of the subtraction of domain signals of both detection elements. As has already been stated, the signals from the rotary magnetic field are thus compensated for.

Figure 15:
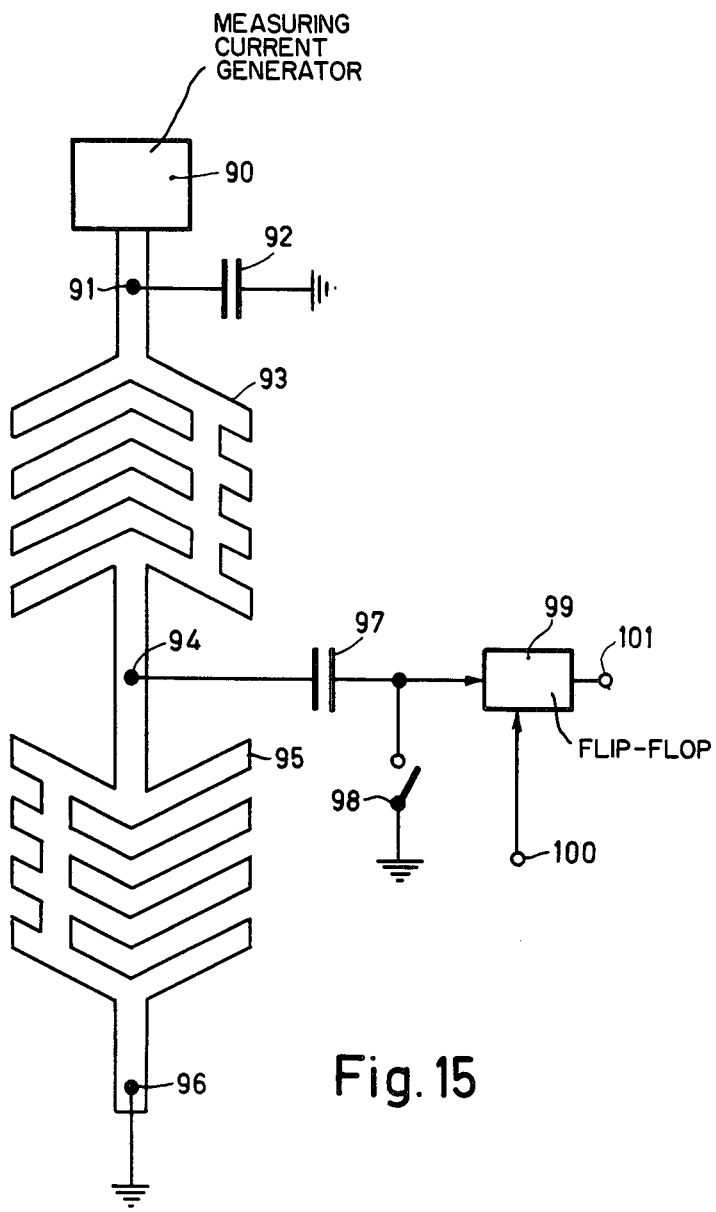
FIG. 15 shows a another detection system in accordance with the invention.

FIG. 15 shows a further version of a detection system in accordance with the invention. The device comprises a measuring current generator 90 which activates the detection elements 93, 95 which are now connected in series. The connection point 96 is directly connected to ground, while the connection point 91 is connected to ground via the capacitor 92. As far as detection signals are concerned, the points 91, 96 then have ground potential. Thus, the difference signal of the two detection elements appears directly on the connection point 94. Normally, switch 98 is closed, so that the input of the flip-flop 99 has ground potential. The capacitor 97 operates for uncoupling d.c. signals. The switch 98 is opened in synchronism with the rotation of the rotary magnetic field (i.e. twice per period), briefly before the instant at which the signal is to be measured. The flip-flop 99 then receives a receive control signal (strobe) on the terminal 100 and sets its binary state in accordance with the value of the signal received. This information is then available for further processing during one half period of the rotary magnetic field. The circuit shown in FIG. 15 is very simple; the signal amplitude, however, has been halved relative to FIG. 14 by the series connection of the elements 93, 95. The connection of the elements 97-100 is known per se from an article by P. C. Michaelis "Magnetic Bubble Mass Memory", IEEE Trans. Magnetics Vol. MAG 11, January 1975, page 21, and can also be used in FIG. 14, for example, on the output 32.

What is claimed is:

1. A magnetic bubble domain memory comprising:
   a layer of magnetic material in which magnetic bubble domains can be propogated, including a bubble domain guide structure on said layer which comprises discrete magnetic elements, and a first magnetoresistive detector;

a bias field generator which produces a bias magnetic field directed transversely to said layer which sustains the magnetic bubble domains in said layer; and a rotary magnetic field generator which produces a rotary magnetic field which drives magnetic bubble domains along said bubble domain guide structure;

said first magnetoresistive detector comprising a connected magnetoresistive element comprising a plurality of chevron elements composed of magnetoresistive material, each chevron element having a first end portion, a center portion, and a second end portion, the respective center portions of said chevron elements being disposed on an axis transverse to the bubble domain movement at said detector; and a plurality of interlinking elements of said magnetoresistive material connecting said chevron elements, a majority of said interlinking elements being disposed between said first end portion and said center portion of said chevron elements, said detector functioning to generate a first signal with a comparatively large amplitude and a second signal with a comparatively small amplitude at different instants for each bubble domain passing along said detector, and for each period of the rotary magnetic field.

2. A memory as claimed in claim 1, further comprising a control element on said layer of magnetic material which functions to drive the domains to said detector by a fitst direction of rotation of the rotary magnetic field.

3. A memory as claimed in claim 1, wherein said bubble domain guide structure comprises a shift register structure having an input and an output connected to said detector, domains and void domain positions being arraged in said shift register structure in direct succession, said shift register structure supplying information represented by said domains and said void domain positions to said detector when said domains are driven to said detector by the rotary magnetic field.

4. A memory as claimed in claim 3, wherein said shift register structure further comprises a domain splitting element having a first output connected to said input of said shift register structure, a second output connected to said detector, and an input connected to said output of said shift register structure.

5. A memory as claimed in claim 1, further comprising a second magnetoresistive detector substantially identical to said first detector, said first and said second detectors being disposed 180° with respect to each other in the plane of said layer.

6. A memory as claimed in claim 5, further comprising difference-determining means having a first input connected to said first detector, and a second input connected to said second detector, and an output which generates an output signal twice during each period of said rotary magnetic field.

* * * * *